United States Patent [19]

Hershberger

[11] Patent Number: 5,124,673
[45] Date of Patent: Jun. 23, 1992

[54] LEVEL INDEPENDENT AUTOMATIC CABLE EQUALIZER

[75] Inventor: David L. Hershberger, Nevada City, Calif.

[73] Assignee: The Grass Valley Group, Inc., Nevada City, Calif.

[21] Appl. No.: 691,898

[22] Filed: Apr. 26, 1991

[51] Int. Cl.[5] .............................................. H04B 3/04
[52] U.S. Cl. ............................................. 333/18; 375/12
[58] Field of Search ...................... 333/18; 375/12, 14; 178/63 E, 69 M

[56] References Cited

U.S. PATENT DOCUMENTS

| | | | |
|---|---|---|---|
| 3,529,244 | 9/1970 | Torick et al. | 333/18 X |
| 3,568,100 | 3/1971 | Tarbox | 333/18 |
| 3,812,436 | 5/1974 | Fudemoto et al. | 333/18 |
| 4,606,043 | 8/1986 | Aprille, Jr. et al. | 333/18 X |

Primary Examiner—Paul Gensler
Attorney, Agent, or Firm—Boulden G. Griffith

[57] ABSTRACT

A multiple section cable equalizer with a signal level detector produces a clipping control signal for amplifiers in each equalizer section, so that a variable level input signal is restored to an equalized output signal that is free of distortion and attendant bit errors. A fixed reference clipping stage after the last equalizing stage produces a signal clipped to a final output level. A feedback path restores DC and low frequencies lost due to AC coupling. A test output stage permits monitoring of the operation of the equalizer stages. The signal level detector contains (in series), a differential amplifier with low pass filtering, a balanced modulator detector, a voltage amplifier, a comparator and peak detector, a transconductance amplifier and a plurality of current mirrors operatively connected to determine a difference current from the output of the transconductance amplifier and convert this to a clipping control signal voltage level. A defeat comparator monitors the output of the comparator and peak detector and replaces the variable difference current with a fixed reference current when an external capacitor used by the peak detector appears to be shorted.

10 Claims, 15 Drawing Sheets

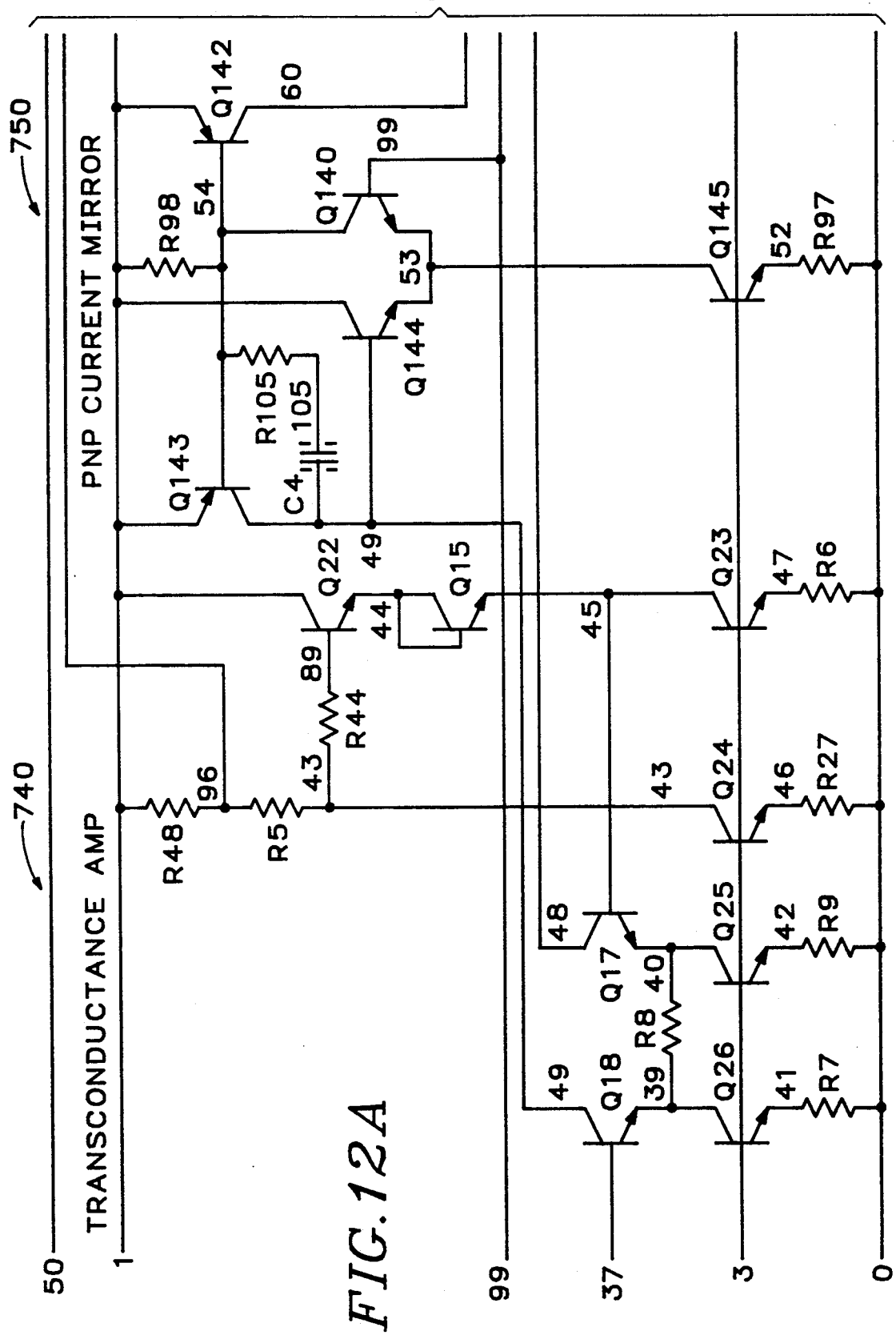

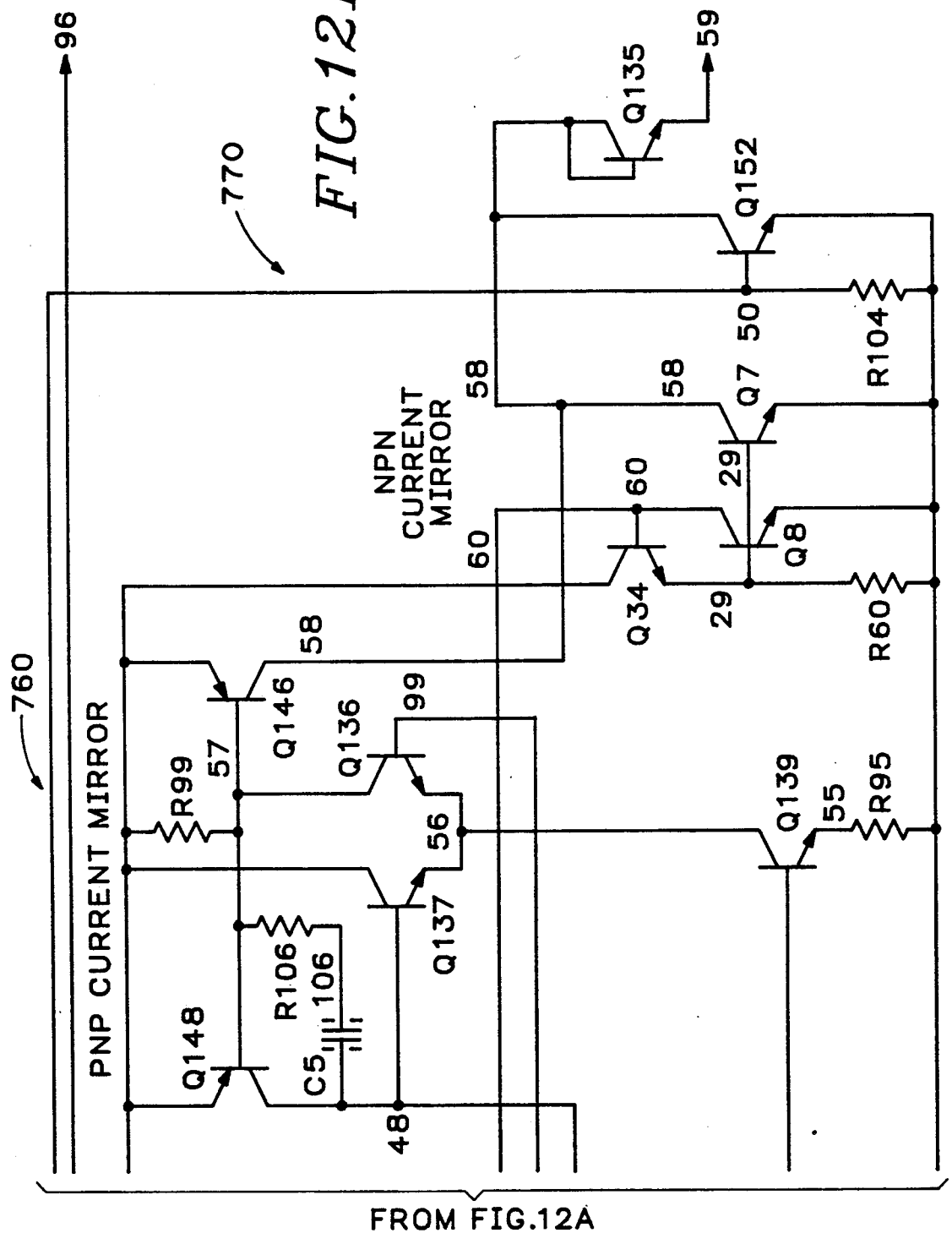

LEVEL INDEPENDENT AUTOMATIC CABLE EQUALIZER

BACKGROUND OF THE INVENTION

This invention relates to automatic cable equalization, and more particularly to an improved "walking limiter" type of automatic cable equalizer.

In a television studio environment, digital television signal equipment may be connected by cables with differing lengths and signal qualities as the systems and their interconnections are reconfigured for different applications. Since the digital signals carried by these cables degrade over longer distances, cable equalizers are used to compensate for these variations. These cable equalizers should be able to compensate for the losses created by 300 meters of cable, with a gain of 30 dB at the high frequencies needed for edge shaping and 6 dB at the lower frequencies of the NRZ (non-return-to-zero) data itself. For the common television standards of NTSC D2, PAL D2 and component D1, clock frequencies of 143 MHz, 177 MHz and 270 MHz, respectively, are involved. The NRZ data for each of these data rates has a theoretical minimum bandwidth of half of these frequencies.

One type of cable equalizer is known as a "walking limiter" equalizer. Such an equalizer comprises multiple equalizer stages. When a walking limiter cable equalizer is presented with an input signal that is degraded to the maximum capability of the equalizer, all of the stages operate linearly to restore the signal as much as possible. However, when a walking limiter cable equalizer is presented with an input signal that has more amplitude and full equalizing is not required, the stage or stages closest to the output go into limiting, so that the output signal is not amplified beyond the desired level.

In a cable equalizer with multiple equalizer stages, each of which clips the signal that it receives to the same, fixed, final level, problems arise in the presence of certain types of input signals. Referring to FIG. 1, if the incoming signal is of good quality, i.e., fairly fast rise times, but an amplitude below the clipping level, the first stage creates an overshoot as it sharpens the high-going transition. This overshoot is clipped, but as it trails off to the correct high level a premature trailing edge is produced. The high frequency gain of the subsequent stages then accentuates this premature trailing edge into a ringing that partially or completely closes the "eye" of the bit interval, causing errors.

One way to correct this problem is to precede the equalizer with an automatic gain control (AGC) amplifier. However, this leads to undesirable complexity and excessive power dissipation.

SUMMARY OF THE INVENTION

It is an object of the present invention to provide an alternative way to produce a wide dynamic range of cable equalization in a manner that does not produce overshoots and consequent bit errors, and yet avoids undesirable complexity and excessive power dissipation.

It is also an object of the present invention to be able to implement the design of the cable equalizer in an integrated circuit (IC) with a minimum of interference between the cable equalization circuitry and other circuitry on the same IC.

In accordance with the invention, there is provided a multiple section cable equalizer with a signal level detector that produces a clipping control signal for amplifiers in each equalizer section, so that a variable level input signal is restored to an equalized output signal that is undistorted and free of bit errors. A fixed reference clipping stage after the last equalizing stage produces a signal clipped to a final output level. A feedback path limits DC drift in the presence of excess data in either state. A test output stage permits monitoring of the operation of the equalizer stages.

In a preferred embodiment, the signal level detector contains (in series) a differential amplifier with low pass filtering, a balanced modulator detector, a voltage amplifier, a comparator and peak detector, a transconductance amplifier and a plurality of current mirrors operatively connected to determine a difference current from the output of the transconductance amplifier and convert this to a clipping control signal voltage level. A defeat comparator monitors the output of the comparator and peak detector and replaces the variable difference current with a fixed reference current when an external capacitor used by the peak detector appears to be shorted.

The subject matter of the present invention is particularly pointed out and distinctly claimed in the concluding portion of this specification. However, both the organization and method of operation, together with further advantages and objects thereof, may best be understood by reference to the following detailed description and accompanying drawings.

BRIEF DESCRIPTION OF THE DRAWINGS

FIG. 12 is a schematic diagram of the transconductance amplifier and two current mirrors;

DETAILED DESCRIPTION

Figure 1:
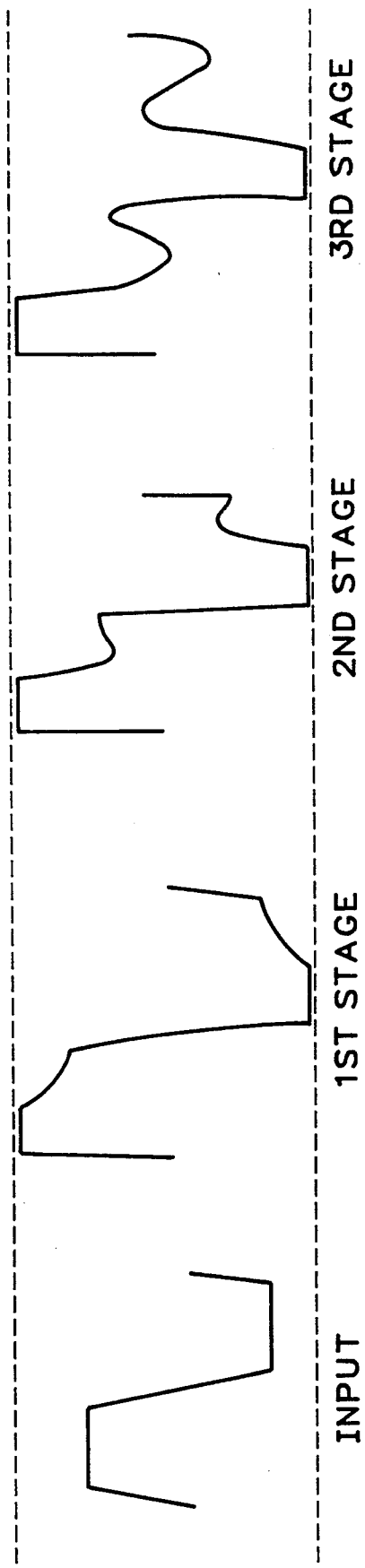
FIG. 1 is an illustration of how cable equalizers with fixed clipping thresholds can treat certain types of input signals inappropriately.
Figure 2:
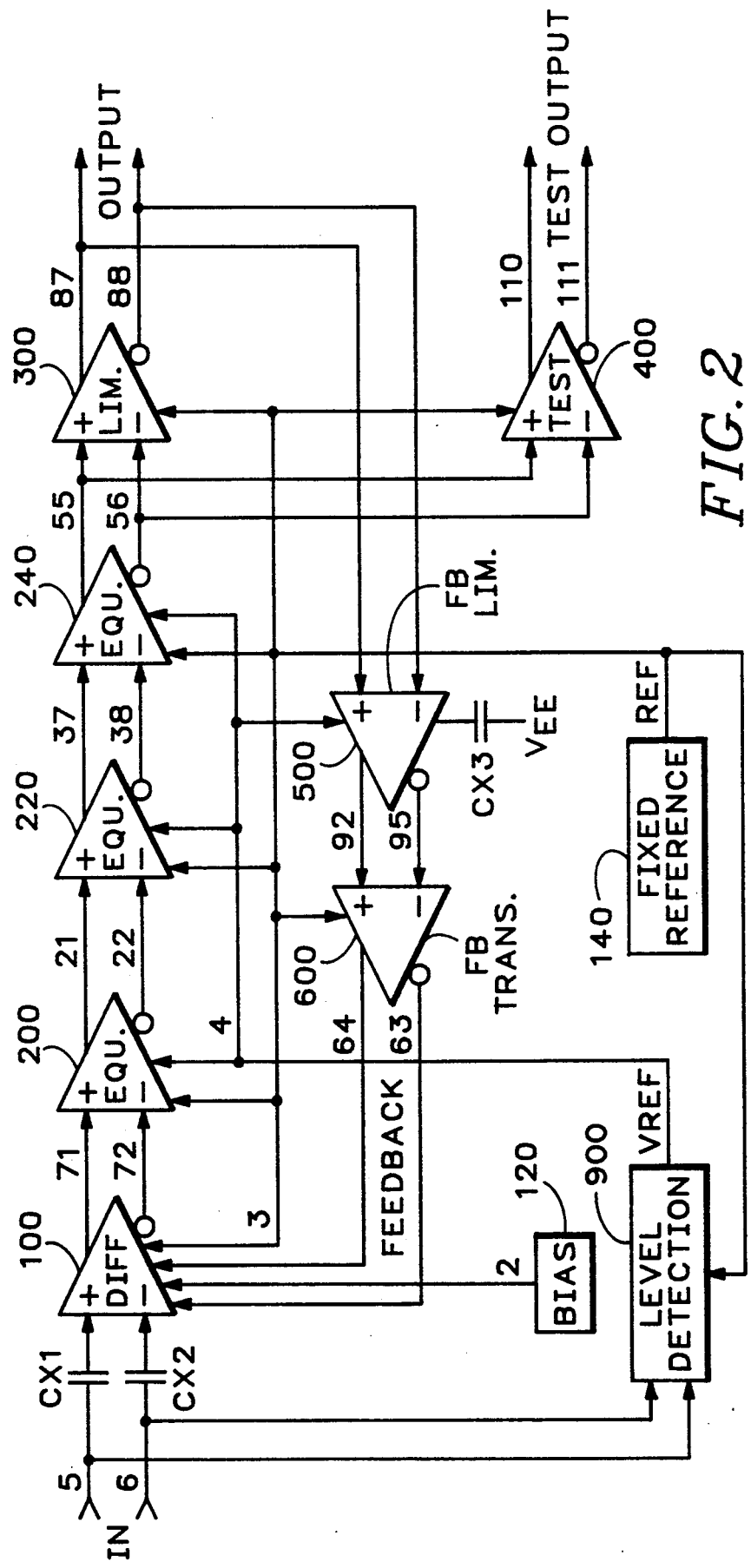
FIG. 2 is a block diagram of the equalizer portion of the level independent automatic cable equalizer of the present invention.

Referring to FIG. 2, a differential input signal, or a single-ended input signal and ground, are applied across DC blocking capacitors CX1 and CX2 to the plus and minus inputs of input differential amplifier 100. Input differential amplifier 100 also receives a fixed reference signal RFF from fixed reference circuitry 140, a BIAS signal from bias circuit 120 and plus and minus sides of a feedback signal. The differential amplifier stage 100 serves to convert any single-ended inputs into differential signals before they reach the first equalizer stage 200. Node numbers, such as 5 and 6 on the input to the input differential amplifier 100, can largely be ignored temporarily in the block level discussion which follows immediately, but will prove very useful in tying together the schematic level discussion which follows further below.

The outputs of differential amplifier 100 are applied to the first of three identical equalizer stages 200, 220 and 240. Each equalizer stage 200, 220 and 240, as will be further described below in connection with a schematic level description, clips its output to a level determined by VREF, a variable reference signal produced by level detection circuitry 900.

The differential outputs of the third equalizer stage 240 are applied to the plus and minus inputs of both limiting differential stage 300 and test output stage 400. Limiting stage 300 and test output stage 400 both receive the fixed reference signal REF, but not the variable reference signal VREF. The test output stage 400 has unity gain and its outputs provide a view for test purposes into the behavior of the equalizer stages 200, 220 and 240 before their output is affected by the limiting stage 300. The output of limiting stage 300 is limited to the full output signal level, regardless of the level of variable limiting that the equalizer stages 200, 220 and 240 have performed in response to the level of VREF.

The differential outputs of the limiting stage 300 are also monitored by feedback limiting stage 500 which operates in response to VREF to limit to the same level as the equalizer stages 200, 220 and 240 have. The differential outputs of the feedback limiting stage 500 are applied to the plus and minus inputs of feedback transconductance amplifier 600, which produces feedback currents that are then supplied to the unity gain differential amplifier stage 100. The differential amplifier stage 100 sums these currents into its output to maintain a suitable DC level in the presence of data containing significantly more of one logic state than another. (This type of feedback circuitry has also sometimes been called "quantized feedback circuitry".)

Figure 3:
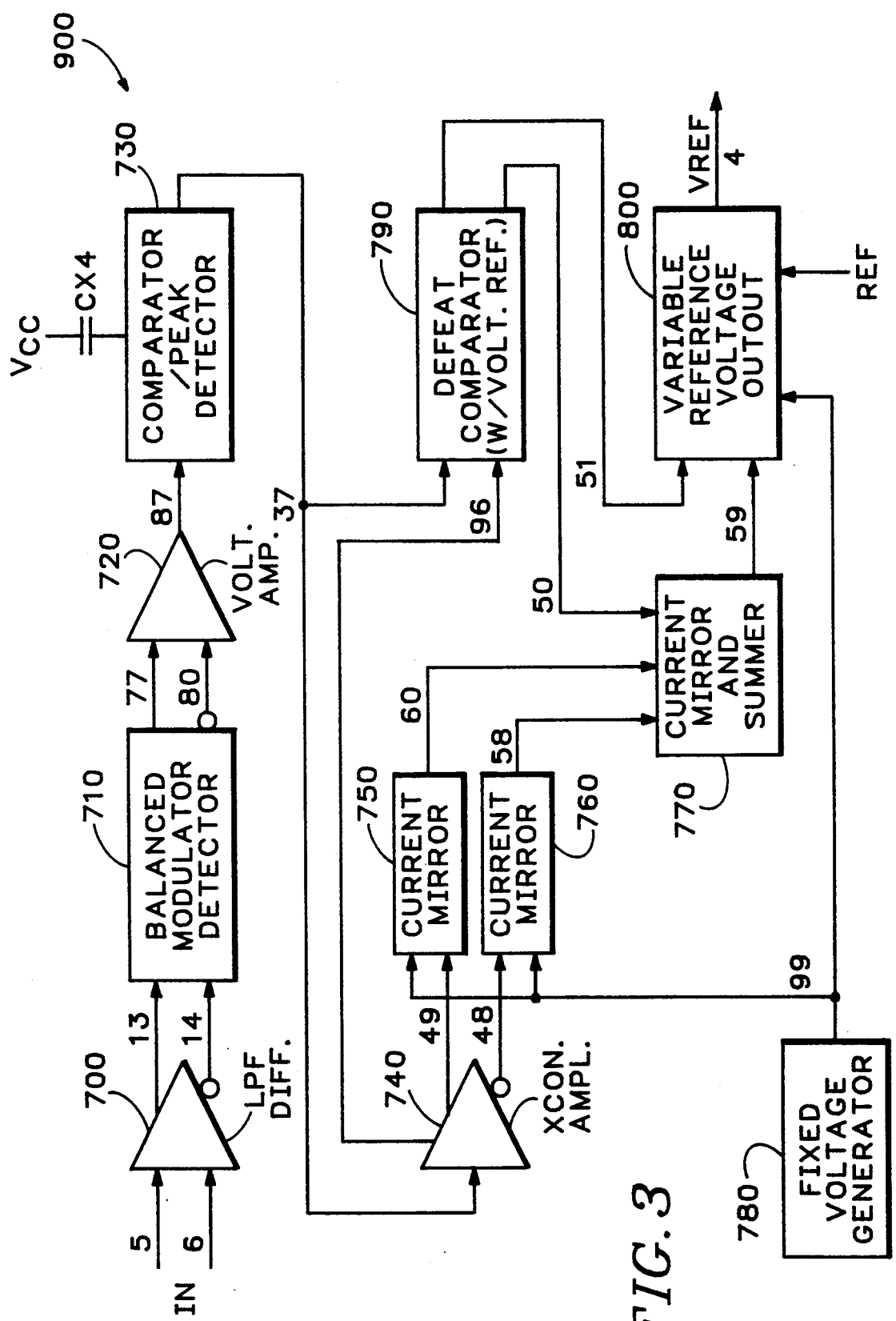
FIG. 3 is a block diagram of the level detection portion of the level independent automatic cable equalizer of the present invention.

The variable reference signal VREF is produced by the level detection circuitry 900, which is shown in detail in FIG. 3. FIG. 3 illustrates a lowpass filtering differential amplifier 700 whose inputs are DC coupled to the input signals at nodes 5 and 6. The outputs of lowpass filtering differential amplifier 700 are applied to the inputs of a balanced modulator detector 710. The balanced modulator detector 710 full-wave rectifies both sides of the signal on its inputs and produces two levels whose difference represents the amplitude of the low frequency component of the input signal. "Low frequency" as used in connection with this invention refers to frequencies below 50 MHz, since this is the highest frequency that is not significantly affected by cable losses.

The output levels from the balanced modulator detector 710 are applied to differential inputs of voltage amplifier 720, which produces a single output voltage that is proportional to the difference in the output levels of the balanced modulator detector 710. This voltage is applied to a comparator and peak detector 730. The comparator portion of the comparator and peak detector 730 provides a fast charging path for the peak detector portion. The peak detection is very fast, but the relaxation of the detected value is relatively very slow.

The output of the comparator and peak detector 730 (node 37) is applied to the input of a transconductance amplifier 740. The transconductance amplifier 740 converts this voltage to a pair of differential currents (nodes 49 and 48). Each of these output currents from the transconductance amplifier 740 is applied to a current mirror, node 49 to current mirror 750 and node 48 to current mirror 760. The summer portion of current mirror and summer 770 sums the current from its internal current mirror, reflecting the current from current mirror 760, with the current from current mirror 750 to produce an output current at node 59 that is equivalent to the difference between the pair of differential currents at the output of the transconductance amplifier 740.

The output of current mirror and summer 770, node 59, is an input to variable reference voltage output circuitry 800. The variable reference voltage output circuitry 800 produces a final output voltage VREF that is proportional to the current from the output of the current mirror and summer 770 (node 59). This reference voltage is proportional to the amplitude of the low frequency content of the input signal.

Fixed voltage generator 780 produces at node 99 a reference voltage required by current mirrors 750 and 760 and by the variable reference voltage output circuitry 800.

The output of the comparator and peak detector 730 (node 37) is also applied to one of the inputs of defeat comparator 790. The other input to the defeat comparator 790 is a reference voltage (node 96) that is generated by a reference voltage generator that is internal to the transconductance amplifier 740. From these two inputs the defeat comparator 790 ascertains whether or not the comparator and peak detector 730 appears to be working properly. If it appears to the defeat comparator 790 that the comparator and peak detector 730 is not functioning properly, the defeat comparator shuts off the output (node 59) of the current mirror and summer 770 (via node 50) and causes the variable reference voltage output circuitry 800 (via node 51) to produce a default variable reference VREF that is equal to the fixed reference REF.

Before referring to the schematic level Figures, it will be helpful to define the levels associated with several circuit nodes that are used throughout the various schematics:

| TABLE OF COMMON NODE VALUES | | |
| --- | --- | --- |
| Node No. | Name | Typical Voltage |
| 0 | $V_{EE}$ | 0.0 V |
| 1 | $V_{CC}$ | +5.0 V |
| 102, 103 | BIAS | +2.75 V |
| 3 | REF | +0.6 V + $V_{BE}$ |
| 4 | VREF | +0.3 V + $V_{BE}$ to +1.2 V + $V_{BE}$ |

Figure 4:
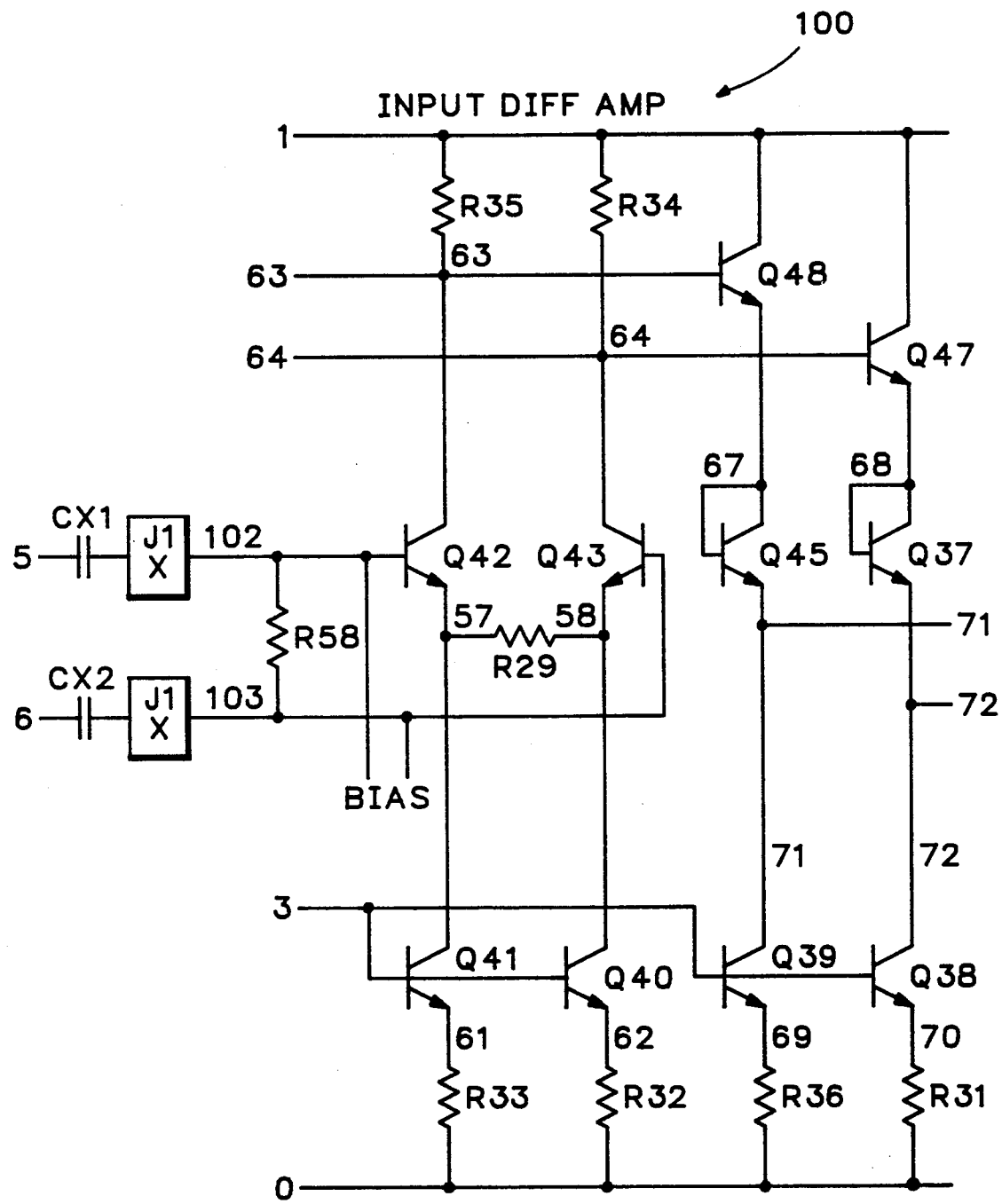
FIG. 4 is a schematic diagram of the unity gain differential amplifier.

Referring now to FIG. 4 in conjunction with FIG. 2, the input signal is AC coupled through the external capacitors CX1 and CX2, and applied to the inputs of a differential amplifier comprising transistors Q42 and Q43. The value of R29 in conjunction with values of the collector resistors R35 and R34 establishes the gain to be approximately unity. The bases of the differential pair Q42 and Q43 are biased to 2.75 Volts by BIAS signals on nodes 102 and 103, as shown in the Table above. 3,510 Ohm resistor R58 in parallel with two 18,000 Ohm bias source resistors (not shown) and an external 76.8 Ohm resistor (not shown) produces a termination resistance of 75 Ohms for the input signal. The fixed reference signal REF on node 3 establishes the maximum current available to the emitters of differential amplifier pair Q42,Q43.

As will be further explained below, the currents on nodes 63 and 64, which are produced by the feedback transconductance amplifier 600, are summed with the currents from the collectors of Q42 and Q43, respectively, by the collector resistors R35 and R34, to produce the actual output voltages of the differential pair. When the input data has on average as many ones as zeros, the currents supplied to nodes 63 and 64 are equal and they have no net effect. However, when the DC level starts to drift towards zero as a result of AC coupling with a long string of data that has a disproportionate number of ones or zeros, these currents become unequal and restore the DC level of the differential signal. The output voltages at nodes 63 and 64 are then buffered and level shifted downward by two base-emitter voltage drops through Q48,Q45 and Q47,Q37, respectively, to produce the outputs of the input differential amplifier stage 100 at nodes 71 and 72.

Figure 5:
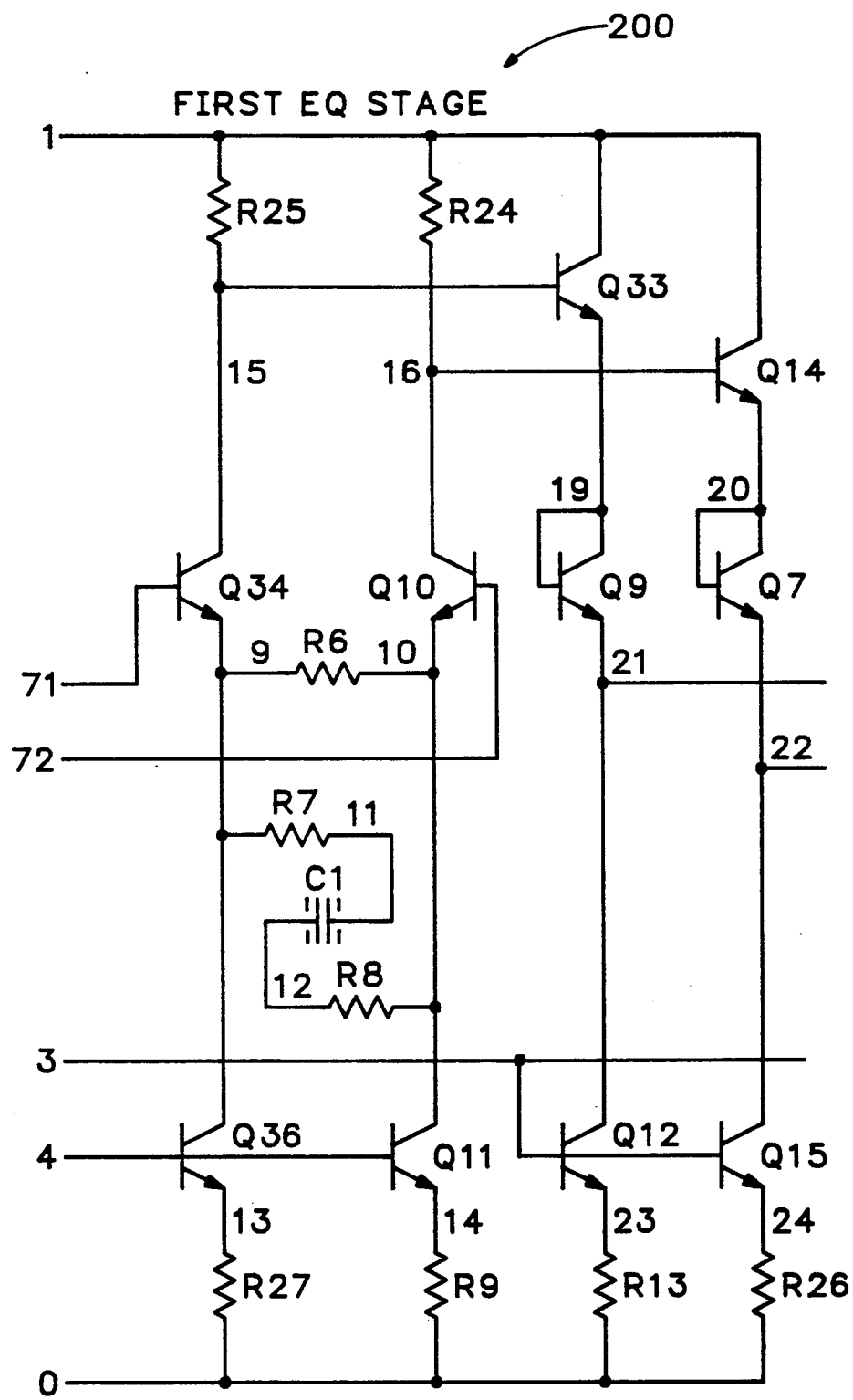
FIG. 5 is a schematic diagram of one of the three identical equalizer stages.

Referring now to FIG. 5, a schematic diagram of the first equalizer stage 200, the outputs from the differential amplifier stage 100 appearing on nodes 71 and 72 are applied to another differential pair, Q34 and Q10. The differential pair Q34,Q10 has approximately unity gain at low frequencies where C1 in the RC network connecting the two emitters presents a very high impedance and the resistance between the two emitters is effectively established by R6. However, at higher frequencies, those above 60 MHz, the decreasing impedance of the path through R7, C1 and R8 begins to appear lower than the resistance through R6, and the gain of the equalizer stage 200 is significantly increased, becoming about 10 dB at frequencies around 135 MHz; 135 MHz being the theoretical minimum bandwidth for D1. (D1 is the fastest of the current video standards.)

The maximum current available to the transistors Q34,Q10 of the differential pair, and therefore the maximum output voltages that can be developed across the collector resistors R25 and R24, is determined by the variable reference voltage, VREF. The output voltages from the differential pair Q34,Q10 are buffered and level shifted down two base-emitter voltage drops by Q33,Q9 and Q14,Q7, respectively, to produce the final output of the equalizer stage 200. The second and third equalizer stages 220 and 240 are identical to the first equalizer stage 200. The overall equalizer with three stages provides up to 30 dB of high frequency signal boosting, capable of compensating for the high frequency losses due to 300 meters of cable.

Figure 6:
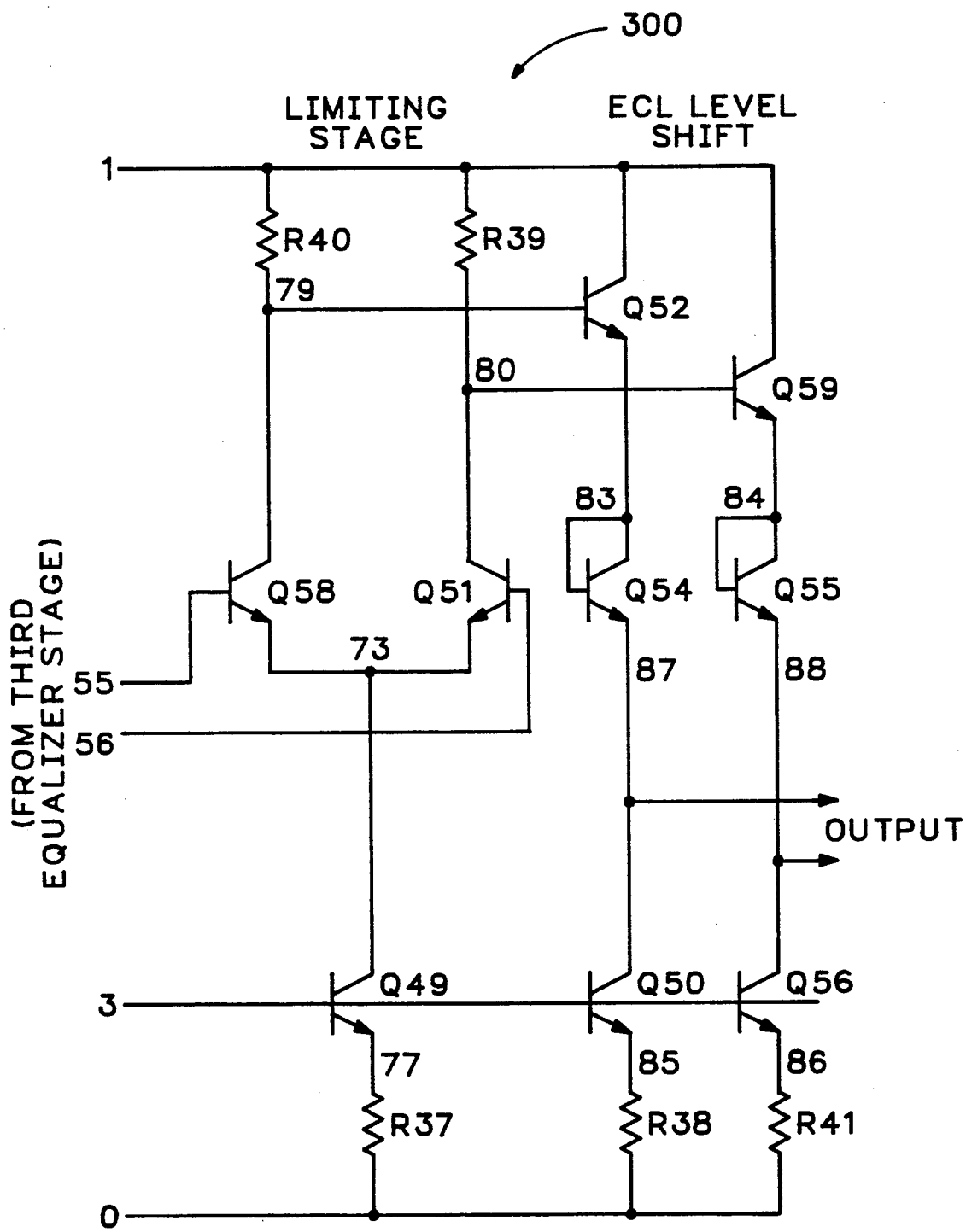
FIG. 6 is a schematic diagram of the limiting differential stage with ECL level shift circuitry.

Referring now to FIG. 6 in conjunction with FIG. 2, the output of the third equalizer stage 240 is presented to the limiting stage 300 at nodes 55 and 56. The emitters of the transistors Q58 and Q51 of the differential amplifier in the limiting stage 300 are directly coupled together, so that these transistors operate as a switch to switch the current from Q49 between the collector resistors R40 and R39 to produce an output that has minimum rise and fall times. Q49 is controlled by the fixed reference voltage REF on node 3, and the relative values of its emitter resistor R37 and the collector resistors R40 and R39 of transistors Q59 and Q51 are selected to produce the desired ECL output level swing of the final output of the overall cable equalizer. As in the preceding stages, the output voltage swings of this differential amplifier are then buffered and level shifted down two base-emitter voltage drops by Q52,Q54 and Q59,Q55 to produce the output signals at nodes 87 and 88. The peak-to-peak differential output between nodes 87 and 88 is 400 millivolts.

Figure 7:
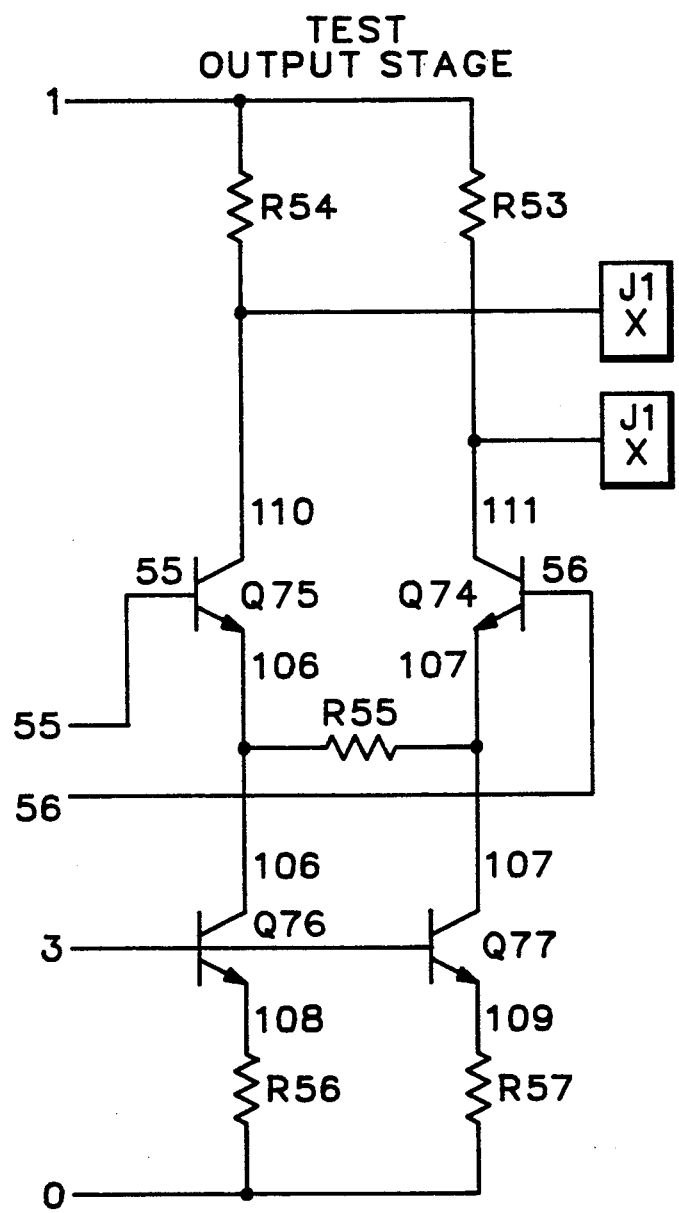
FIG. 7 is a schematic diagram of the test output stage.

Referring to FIG. 7, as well as FIG. 2, the output of the third equalizer stage 240 is also presented to the test output stage 400 at nodes 55 and 56. The transistors of differential amplifier Q75,Q74 are relatively large, are biased at a high current, and are loaded with low impedance load resistors. This low impedance output is suitable for driving a low impedance load, including a high level of pad and cable capacitance.

Figure 8:
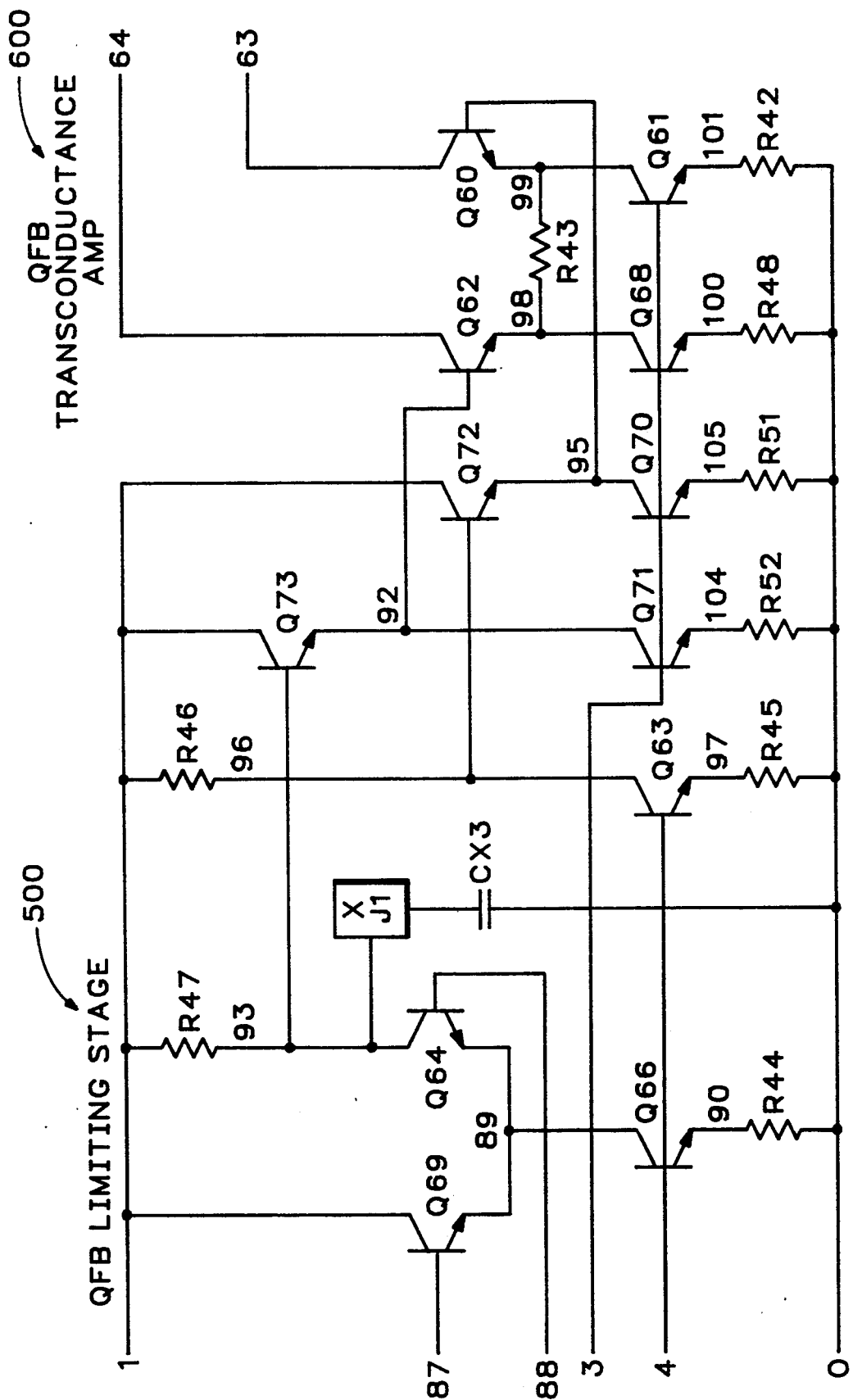
FIG. 8 is a schematic diagram of the feedback limiting stage and the feedback transconductance amplifier.

Referring now to FIG. 8 in conjunction with FIG. 2, the output of the limiting stage 300, at nodes 87 and 88, is monitored by the feedback limiting stage 500. Nodes 87 and 88 are connected to the bases of transistors Q69 and Q64, another differential pair. Transistors Q69 and Q64 share the current from the current source formed by Q65 and R44. This current source is controlled by the variable reference signal VREF. The collector of Q64 is connected to external capacitor CX3, resistor R47 and the base of emitter follower Q73.

A second current source formed by Q63 and R65 is controlled by the variable reference signal VREF. The voltage developed across R46 by the current from the latter current source is applied to the base of another emitter follower Q72. The emitters of Q73 and Q72 are connected to the bases of a differential pair of transistors Q62 and Q60, respectively, which form the feedback transconductance amplifier 600. Note that R45 is twice as large as R44.

To illustrate the operation of the feedback limiting stage 500 and transconductance amplifier 600, let us first imagine that the NRZ data passing through the cable equalizer has been a long string of one, zero, one, zero, etc. Under these conditions Q64 is fully conducting half of the time. Because R44 is half of the size of R45, the average current through Q64 is the same as the constant current through Q63. The RC time of CX3 and R47 is long compared with the bit data rate, so the voltage on CX3 and the base of Q73 is equal to the voltage on the base of Q72. Therefore, under these circumstances, the currents through Q62 and Q60 of the feedback transconductance amplifier 600 are balanced and no net steering of the DC level of the output of the input differential amplifier 100 connected to nodes 63 and 64 occurs.

When different data arrives, such as one, one, zero, one, one, zero, etc., the average current through Q64 will differ from the current through Q63, and the charge on CX3 and the voltage on the base of Q73 will become different from the constant voltage on the base of Q72. The resulting voltage difference of the bases of Q62 and Q60 will cause a difference in the currents being supplied to nodes 64 and 63, and net steering of the DC level from the output of the input differential amplifier 100 occurs. In this way, the difference current supplied by the feedback transconductance amplifier 600 restores any DC component lost by AC coupling through coupling capacitors CX1 and CX2 at the input of the input differential amplifier 100.

For correct restoration of the DC component lost by AC coupling through capacitors CX1 and CX2, the time constant of CX3 and R47 should be equal to the time constant associated with CX1, CX2, R58 (FIG. 4) and the two 18,000 Ohm bias source resistors (not shown), and the loop gain through the feedback path should be near unity. In this implementation, the time constants of both of these circuits correspond to a frequency of about 2 MHz and the loop gain is about 0.9. The loop gain is determined by the selection of the value of R43 between the emitters of Q62 and Q60. In practice it is prudent to design toward a gain of about 0.9, rather than 1.0, since it is safer to under-compensate than to over-compensate, given that an amplifier with a gain in excess of 1.0 may become unstable and process and temperature variations must be anticipated and guarded against.

FIGS. 9 through 14 illustrate in schematic diagrams the circuitry shown in block diagram form in FIG. 3, all of which is shown as block 900 in FIG. 2. The node numbers in FIGS. 9 through 14 in many cases duplicate the node numbers used in FIGS. 4 through 8, but they are different and should not be confused with their counterparts in the other set of schematics.

Figure 9:
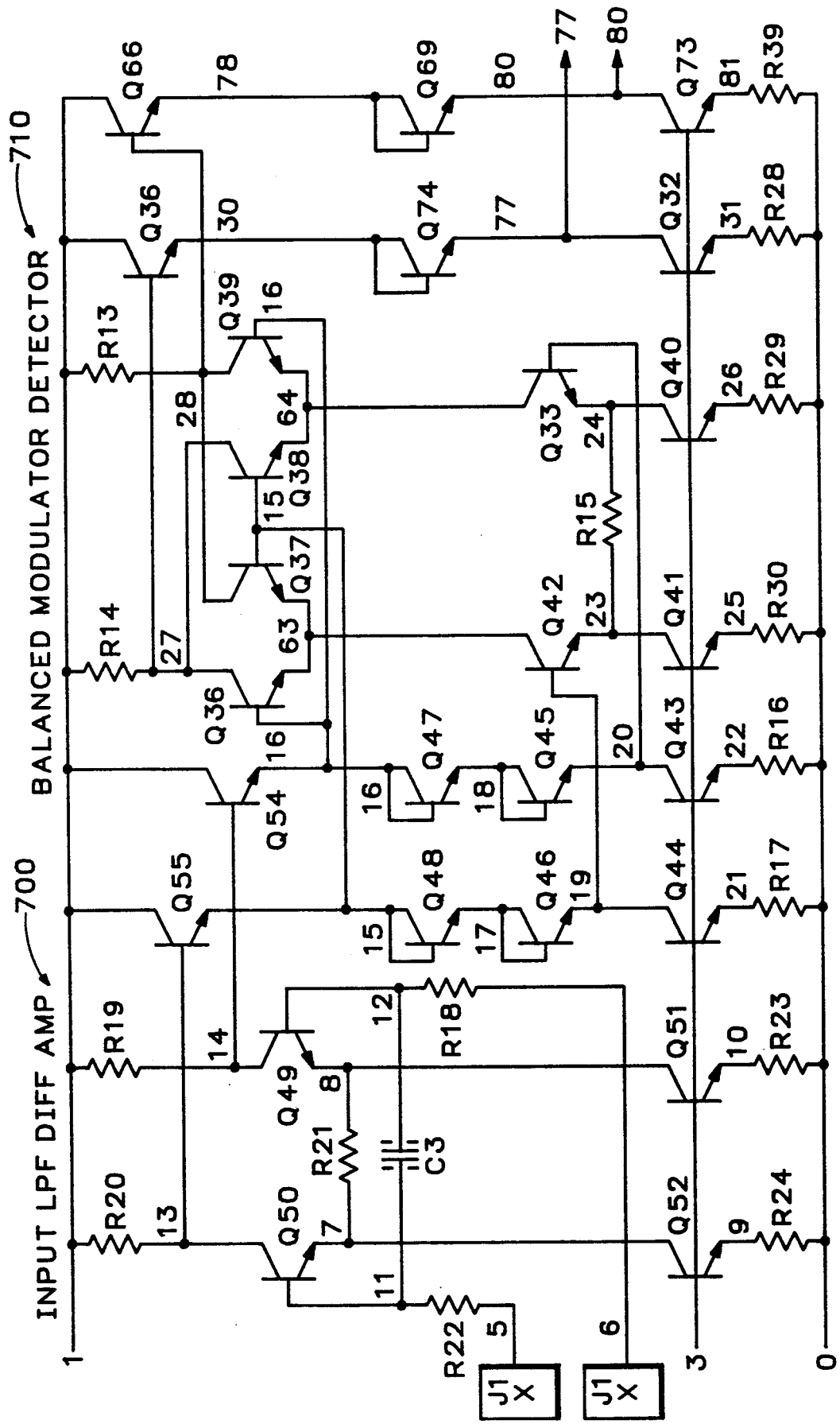
FIG. 9 is a schematic diagram of the input low pass filter and differential amplifier and the balanced modulator detector.

Referring to FIG. 9, the input low-pass filtering differential amplifier stage 700 is DC coupled to the input signal on nodes 5 and 6. The low-pass filtering characteristic of this stage is determined by the RC network consisting of R22, C3 and R18. To ensure the elimination of all high frequency noise and spurious signals, the time constant of this network is chosen to correspond to a cut-off of around 50 MHz. Although this filtering rolls off significant high frequency components of the signal, the original signal amplitude prior to cable losses can most accurately be determined by measuring the low frequency part of the signal (arising, for example, from several consecutive ones or zeros).

The differential amplifier consisting of Q50 and Q49 has about unity gain, its main function being to ensure for the circuitry downstream that the input signal is differential in the event that the input is being driven by a single-ended signal. The outputs of this stage are buffered and dropped one base-emitter voltage by Q55 and Q54 and input (at nodes 15 and 16) to the upper portion of the balanced modulator detector 710, consisting of switching differential pairs Q36,Q37 and Q38,Q39. These outputs of the input low-pass filtering differential amplifier stage Q50,Q49 are further dropped an additional two base-emitter voltages by diode connected transistors Q48,Q46 and Q47,Q45, and then applied (at nodes 19 and 20) to the inputs of a current modulating differential pair Q42,Q33. The current outputs of the balanced modulator detector (at nodes 27 and 28) are full-wave rectified versions of the input signals. These are then buffered and dropped two base-emitter voltage drops by emitter followers Q35 and Q66 and diode connected transistors Q74 and Q69, and then appear at high output node 77 and low output node 80.

Figure 10:
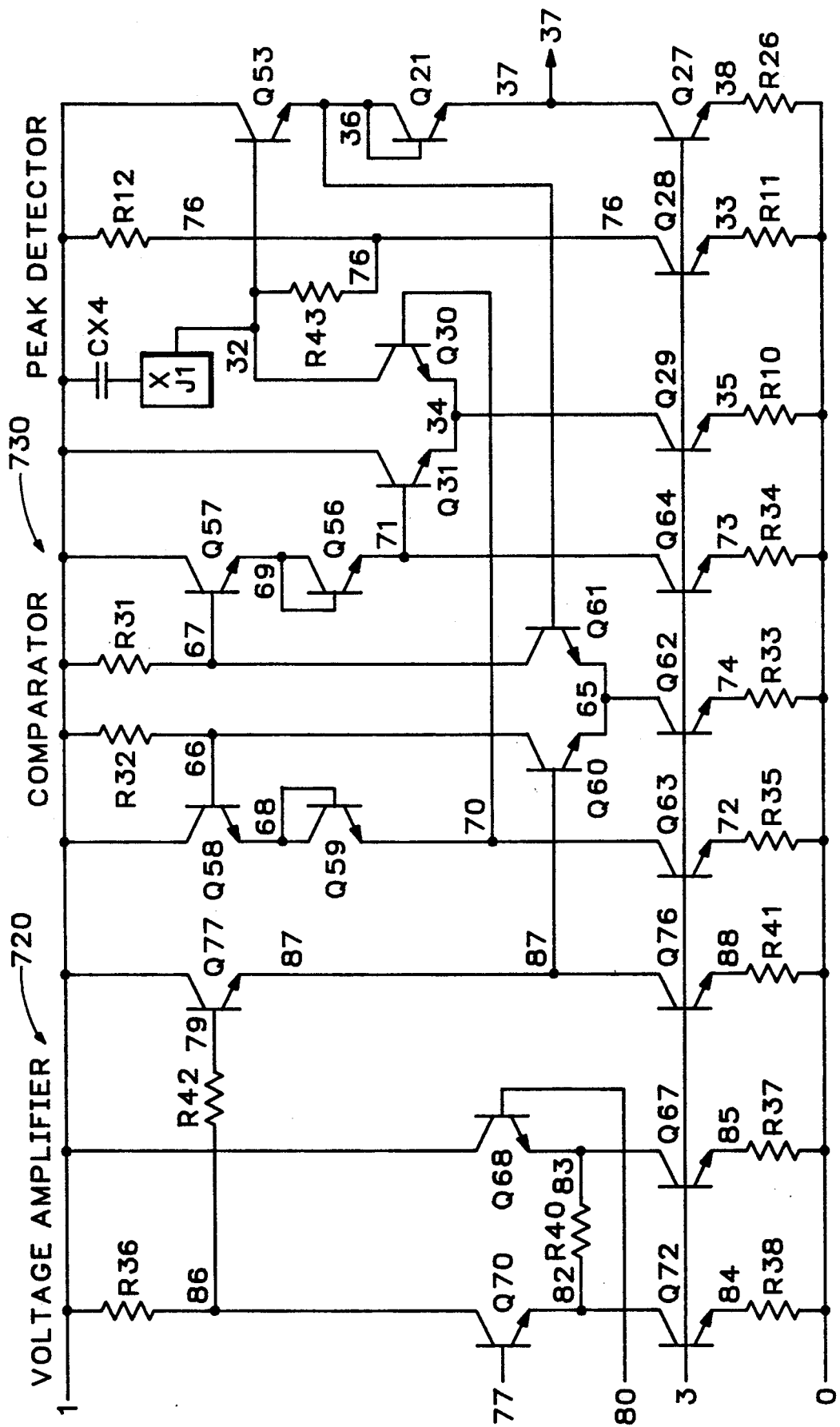
FIG. 10 is a schematic diagram of the voltage amplifier, the comparator and the peak detector.

Referring next to FIG. 10, as well as FIG. 3, the outputs of the balanced modulator detector 710, nodes 77 and 80, are applied to the inputs of voltage amplifier 720 on the bases of transistors Q70 and Q68. The voltage amplifier develops its output across resistor R36. The voltage developed across the 4K resistor R36 is applied to the base of transistor Q77 through 50K resistor R42. Emitter follower transistor Q77 buffers this signal and drops it by one base-emitter voltage drop and applies it to the base of transistor Q60, one side of the comparator portion of comparator and peak detector 730.

The other side of the comparator, transistor Q61, receives its input from the node 36 output of the peak detector portion of the comparator and peak detector 730. Node 36 is the emitter of emitter follower transistor Q53 whose base is connected to $V_{CC}$ through a 50K resistor R43 and a 4K resistor R12. Note that these resistors on the base of Q53 have the same values as the resistors on the base of Q77. The matching of these resistors within the same IC process ensures that even in the presence of process and temperature variations, the relative resistance in the base circuits of transistors Q53 and Q77 will remain equivalent.

The comparator Q60,Q61 is then monitoring and comparing the output of the voltage amplifier at node 79 with the charge on the external 200 pF capacitor CX4 at node 32 in the peak detector. When the voltage at node 86 is more positive than the voltage at node 32, Q60 conducts and Q61 does not. Thus, node 66 is lower than node 67, and these relative voltages, after they are buffered and dropped two base-emitter voltage drops through emitter followers Q58 and Q57 and diode connected transistors Q59 and Q56, cause Q30 to be shut off and the current from Q29 to go through Q31, and the charge on CX4 to remain approximately the same.

When the voltage from the voltage amplifier at node 86 becomes more negative than the charge on CX4, Q61 conducts and Q60 does not. Node 67 is then lower than node 66, causing Q31 to shut off and the current from Q29 to go through Q30, charging CX4. The detected peak output voltage is buffered and dropped one base-emitter voltage drop by emitter follower Q53 to provide the signal to the base of Q61, and dropped another base-emitter voltage drop by diode connected transistor Q21 to produce the output of the comparator and peak detector 730 at node 37.

The discharge path for CX4 through the 54K resistance path of resistors R43 and R12 is quite slow compared with the data being monitored. The RC time of this 200 pF, 54K Ohm discharge path is 10.8 microseconds, compared with the incoming data rate of about 100 MHz (10 ns). Transistors Q29 and Q30 each have a large emitter area and therefore have a low emitter resistance. Consequently, the RC time of the charging path of CX4 is determined by the 700 Ohm emitter resistor of Q29 and is about 140 ns. Thus, the peak detector is fast attack and slow release.

When there is no signal input to nodes 5 and 6, the node 77 and node 80 inputs to the voltage amplifier 720 are in balance and the current available to Q70 is determined by REF on node 3. Recalling that REF is 0.6 Volts plus one base-emitter voltage, the voltage across R38 on the emitter of transistor Q72 is 0.6 Volts and the current that flows is about 214 uA. That current produces a voltage drop of about 0.86 Volts across R36 with its 4K Ohm value. The comparator and peak detector 730 then ensure that that voltage is also maintained on CX4.

Figure 11:
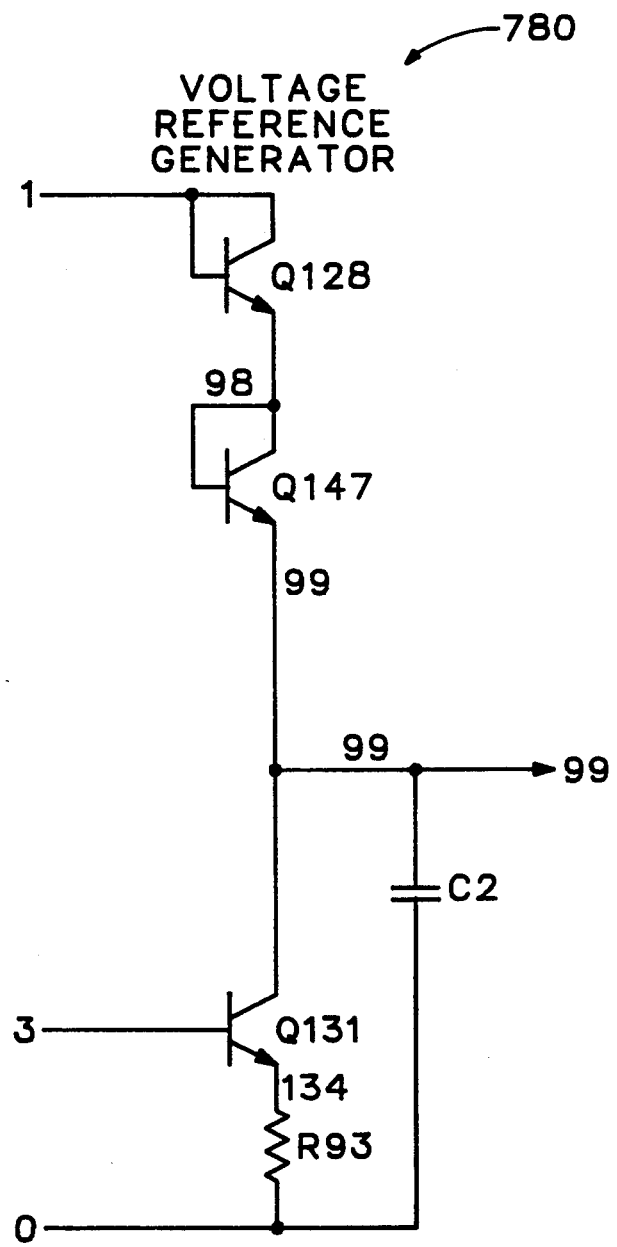
FIG. 11 is a schematic diagram of the voltage reference generator.

Referring now to FIG. 11 as well as FIG. 3, the fixed voltage generator 780 produces a reference voltage from current source transistor Q131 and its emitter resistor R93 that is two base-emitter voltage drops down from $V_{CC}$ as a result of diode connected transistors Q128 and Q147. Capacitor C2 provides some decoupling to ground. This reference voltage is supplied to current mirrors 750 and 760 and to the variable reference voltage output circuitry 800 which also contains a current mirror.

Referring now to FIG. 12 as well as FIG. 3, the node 37 output of the comparator and peak detector 730 is the input to transconductance amplifier 740 on the base of Q18. The other side of differential pair Q18,Q17, the base of transistor Q17, receives a locally derived reference voltage generated by the application of the current from transistor Q24 and its emitter resistor R27 to the 4K collector path consisting of the two 2K resistors R48 and R5, after it has been buffered and dropped two base-emitter voltage drops by emitter follower Q22 and diode connected transistor Q15.

Note that the circuit composed of transistor Q24, emitter resistor R27, collector resistors R5 and R48 and emitter follower Q22 with its base resistor R44 closely matches, with respect to resistance values and emitter areas, the circuit in the voltage amplifier 720 (FIG. 10) composed of transistors Q70 and Q72, emitter resistor R38, collector resistor R36 and emitter follower Q77 with its base resistor R42. Therefore, when produced within the same IC and process these two circuits will be well matched, even in the presence of process and temperature variations.

Referring now to FIG. 10 as well as FIG. 12, if no input signal is present, the operation of the comparator and peak detector 730 drives node 36 to the same voltage level as node 87. Since node 37 is one base-emitter voltage drop below node 36 and node 45 is one base-emitter voltage drop below node 44, nodes 37 and 45 will be at the same voltage. Thus, in the absence of an input signal, the two current outputs of the transconductance amplifier 740 are balanced. Further, node 43 will be at the same voltage level as node 86, or −0.86 V relative to $V_{CC}$, and node 96 will be at −0.43 V relative to $V_{CC}$.

When a signal input is present, the voltage on node 37 will vary in proportion to the level of the low frequency component of that signal, as described above, and the other node 45 of the transconductance amplifier 740 will remain fixed at the level that was present in the absence of a signal. Accordingly, the current output on node 49 to PNP current mirror 750 will increase, while the current output on node 48 to PNP current mirror 760 decreases by the same amount.

The bases of both Q140 on the right side of PNP current mirror 750 and Q136 on the right side of PNP current mirror 760 are connected to the output of the fixed voltage generator 780 on node 99. Looking for example at the first PNP current mirror 750, as the current through node 49 increases, the differential pair Q144 and Q140 operates to increase conduction through Q142 causing both of the PNP transistors, Q143 and Q142, to turn on to hold node 49 at the same voltage as the reference on node 99. Thus, the output current through node 60 increases, mirroring the current in node 49.

The output of the first PNP current mirror 750 is one input to the NPN current mirror 770. As the voltage on the base of transistor Q34 attempts to change in response to changing current through node 60, this change is transmitted by the emitter following action of Q34 to the base of transistor Q8, which in response alters its conduction to permit the new amount of current to flow. Because the base of transistor Q7 is tied to the same node (29) as the base of transistor Q8 and both transistors have the same emitter areas, a current is produced through Q7 that is the same as the current through Q8.

The second PNP current mirror 760 operates in the same way as the first PNP current mirror 750, producing a current at node 58 that is the same as the current at node 48. The output of the second PNP current mirror 760 is applied to node 58, where it is partially cancelled by the current from the NPN current mirror output transistor Q7. The difference in these two currents is supplied by a diode connected transistor Q135, since transistor Q152 is normally off. The node 59 current that flows through Q135 is the difference between the two current outputs of the transconductance amplifier 740, and provides the input to the variable reference voltage output circuitry 800.

In a semiconductor process that is generally optimized for NPN transistors, PNP transistors can best be implemented as lateral PNP transistors. However, lateral PNP transistors are typically slow and have low beta values. In the process used for an actual implementation, a beta of 20 was achieved, but the low speed of the lateral PNP transistors tended to cause oscillations. To eliminate this tendency, current mirror 750 includes a pole-zero compensation network consisting of R105 and C4. The exact optimum values used for this network depend on process details and the exact type of NPN transistors being employed. Resistor R98 provides a path for the collector current of Q142 so that the currents through the differential pair Q144 and Q140 are more closely matched. Otherwise, the only current on the Q142 side would be the emitter currents of the PNP transistors Q143 and Q142. R98 also contributes to the stability of the circuit's operation, and thereby assists the compensation network of R105 and C4 in preventing oscillations.

Figure 13:
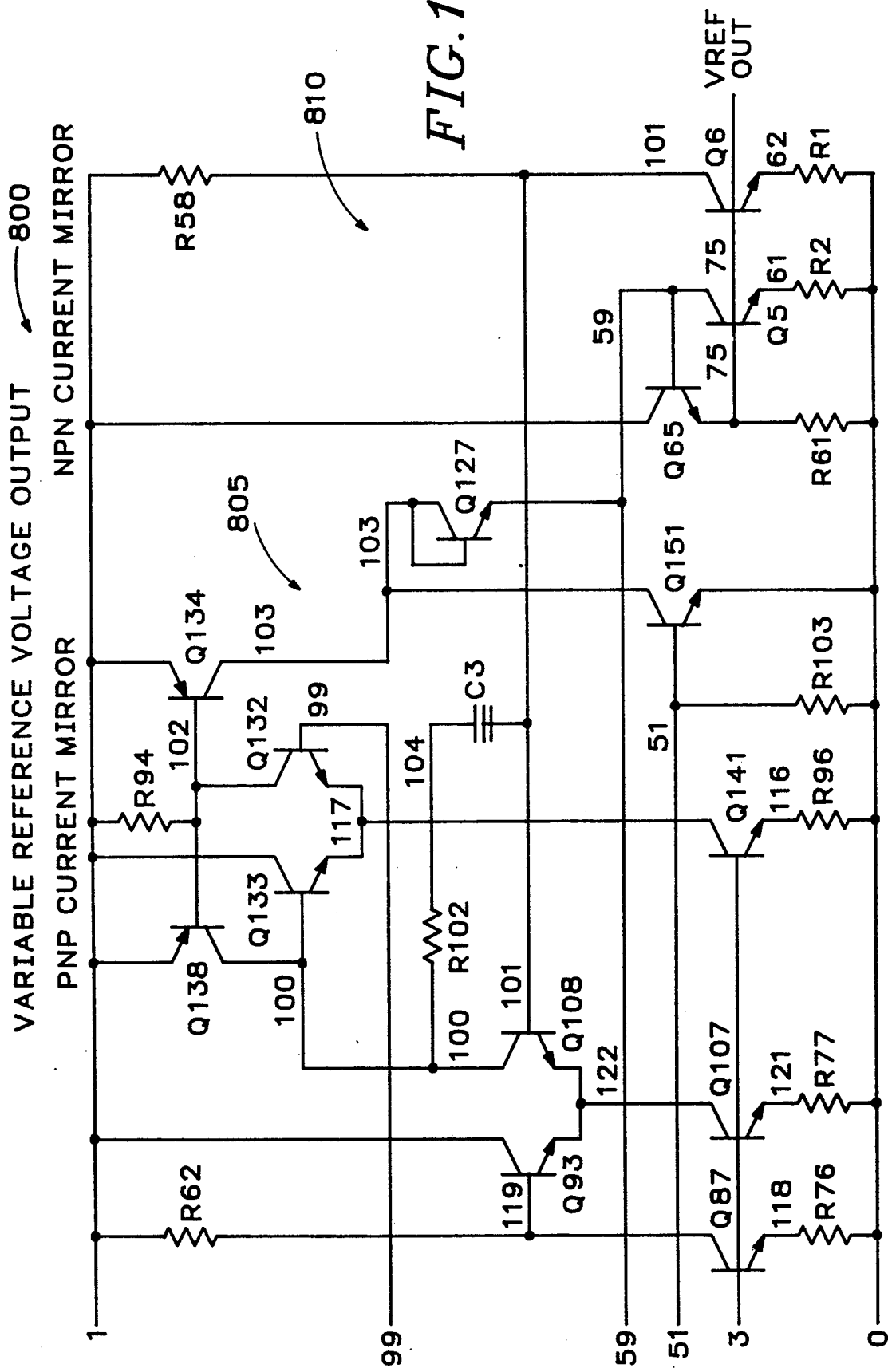
FIG. 13 is a schematic diagram of the current mirror and output current source.

Referring now to FIG. 13 as well as FIG. 3, the node 59 input to the variable reference voltage output circuitry 800 is applied to one side of an amplifying NPN current mirror 810 that produces the variable reference voltage output VREF. This current flows through transistor Q5 under the control of feedback through emitter follower transistor Q65 and a current 25% larger flows through transistor Q6 due to the relationship between the values of resistors R2 and R1. The VREF output, which is the voltage on the bases of the NPN current mirror transistors Q5 and Q6, appears on node 75. The output voltage VREF is the voltage developed across R2 by the difference current on node 59 plus one $V_{BE}$.

For a nominal input voltage 0.8 Volt peak-to-peak on nodes 5 and 6, the level detection portion of the cable equalizer produces 100 uA of current through R2. With R2 having a value of 6,000 Ohms, this 100 uA of current produces 0.6 Volts plus one base-emitter voltage drop on node 75, the VREF output. For the maximum expected peak-to-peak input voltage of 1.6 Volts the output is 1.2 Volts plus one $V_{BE}$. And, for the minimum input signal of 0.4 Volts peak-to-peak the output is 0.3 Volts plus one $V_{BE}$. In general, VREF=$\frac{3}{4}*V_{IN}+V_{BE}$.

The variable reference voltage output circuitry 800 also includes a PNP current mirror 805, the operation of which will be described in connection with the discussion of FIG. 14.

Figure 14:
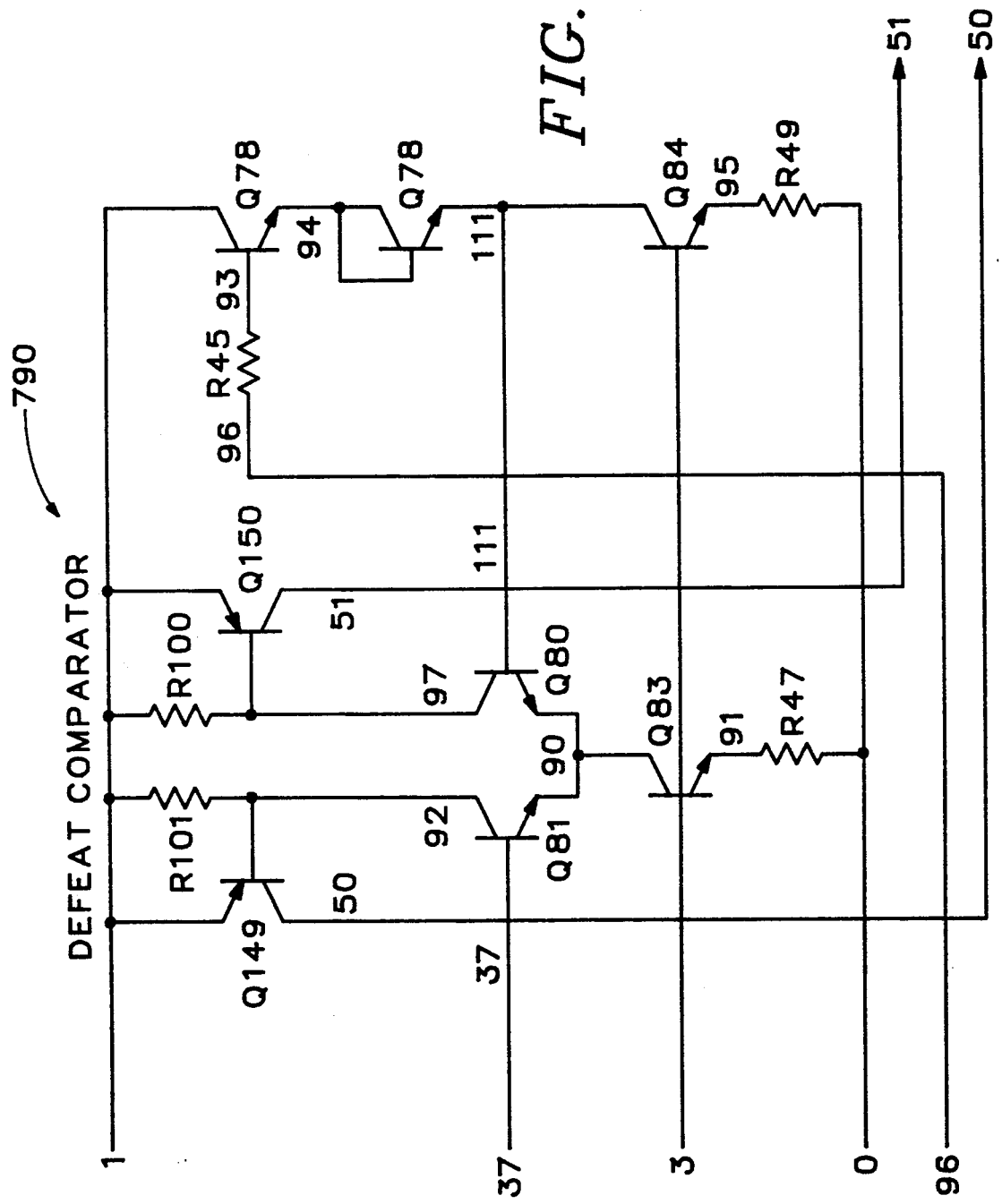
FIG. 14 is a schematic diagram of the defeat comparator.

Referring to FIG. 14 and to FIG. 3, the defeat comparator 790 compares the voltage on node 37 with that on node 111, which is the voltage level on node 96 dropped two base-emitter voltage drops by emitter follower transistor Q78 and diode connected transistor Q79. Node 37 is the peak detector output at node 32 (see FIG. 10) dropped two base-emitter voltage drops. Thus, a comparison between nodes 37 and 111 is really a comparison between nodes 96 and 32.

If node 37 is more negative than node 111, which will always be the case in normal operation, Q80 will conduct and Q81 will not. The higher voltage on the base of Q149 causes it to shut off, while the lower voltage on the base of Q150 causes it to conduct. With Q149 off, the voltage on node 50 goes low, while with Q150 on, the voltage on node 51 goes high.

Referring now to FIG. 12, the low voltage level on node 50 keeps Q152 off and current flows through Q135 and node 59 normally, as described above. Referring now to FIG. 13, the high voltage level on node 51 keeps Q151 turned on and the output of the PNP current mirror 805 in the variable voltage output circuitry 800 is shunted to node 0, $V_{EE}$.

Referring now to FIGS. 10, 12 and 14, the only time that node 37 will be positive relative to node 111 is if the external capacitor is shorted to $V_{CC}$, either intentionally or inadvertently. When this has occurred, the situation just described is reversed. That is, node 50 goes high and node 51 goes low. A high on node 50 causes Q152 to conduct causing the summed currents from the three current mirrors 750, 760 and 770 to be shunted to $V_{EE}$. And, referring to FIG. 13, a low on node 51 shuts off Q151 eliminating the shunt path for the current from the PNP current mirror 805. With this shunt path eliminated, the current being produced by Q134 in the PNP current mirror flows through diode connected transistor Q127.

The base of Q87 is biased with the fixed reference voltage REF at 0.6 Volts plus one base-emitter drop voltage. That causes the emitter of Q87 to produce 0.6 Volts, which causes 125 uA to flow through R76, the 4,800 Ohm emitter resistor. The flow of this 125 uA through the 20K Ohm collector resistor R62 provides a bias voltage on the base of Q93 that is $-2.5$ Volt relative to $V_{CC}$. The base of Q108, the other side of that differential pair, is tied to the collector of output transistor Q6, which is identical in its size and its emitter and collector resistor values with Q87. Thus, the differential pair Q93 and Q108 will only be in balance when the current through Q6 equals the current through Q87. The output of the differential pair Q93 and Q108 regulates the current through Q6 necessary to achieve this balance via the output of the PNP current mirror consisting of transistors Q133, Q132, Q138 and Q134 and its output path through diode connected transistor Q127 and the other side of the amplifying NPN current mirror 810 that Q6 is part of.

Thus, when the output of the defeat comparator 790 switches to the "defeat" state, indicating that the external capacitor CX4 has been shorted, this PNP current mirror 805 causes the variable reference voltage VREF to go to the same voltage level as the fixed voltage reference REF, i.e., 0.6 Volts plus one base-emitter voltage drop.

By relying on the use of the ratios between resistors, rather than the absolute values of resistors, the design described above is made robust in the face of process and temperature variations.

By the use of variable clipping levels, as derived and applied above the automatic cable equalizer of the present invention is able to accept a variable input signal and produce an equalized output signal that is free of distortion and attendant bit errors.

While a preferred embodiment of the present invention has been shown and described, it will be apparent to those skilled in the art that many changes and modifications may be made without departing from the invention in its broader aspects. The claims that follow are therefore intended to cover all such changes and modifications as fall within the true scope of the invention.

I claim:

1. An automatic cable equalizer for compensating for a variable level input signal with possibly degraded rise and fall times, the equalizer comprising:
   equalizer means, having an input and an output, with the input coupled to receive the variable level input signal, the equalizer means containing amplifying means, high frequency gain boosting means and clipping means, the clipping means having a clipping control input coupled to receive a clipping control signal;
   signal level detecting means coupled to monitor the variable level input signal and for producing the clipping control signal, the clipping control signal being proportional to the peak level of the rectified low frequency content of the variable level input signal.

2. An automatic cable equalizer according to claim 1 further comprising:
   an AC coupling capacitor coupled to the equalizer input; and
   feedback means having an input and an output, with the input coupled to receive the output of the equalizer section and with the output coupled to restore the DC lost by AC coupling.

3. An automatic cable equalizer according to claim 2, wherein an RC time associated with the AC coupling capacitor is approximately equal to an RC time associated with the feedback means.

4. An automatic cable equalizer according to claim 1 further comprising a limiting section having an input and an output, with the input coupled to receive the output of the equalizer section, the limiting section limiting to a fixed clipping level.

5. An automatic cable equalizer according to claim 1 further comprising a test output stage having approximately unity voltage gain, a high impedance input and a low impedance output, with the input coupled to the output of the equalizer.

6. An automatic cable equalizer according to claim 1, wherein the signal level detecting means comprises:
   low pass filtering means coupled to receive the variable level input signal and produce a low frequency content signal;
   rectifying means coupled to receive the low frequency content signal and producing a rectified low frequency content signal;
   peak holding means coupled to receive the rectified low frequency content signal and producing a maximum low frequency content signal; and
   scaling means coupled to receive the maximum low frequency content signal and producing the clipping control signal proportionally to the maximum low frequency content signal.

7. An automatic cable equalizer according to claim 6, wherein the peak holding means comprises:
   charge storing means for holding a peak charge;
   comparator means having a first input, a second input and an output, with the first input coupled to receive the rectified low frequency content signal and the second input coupled to receive an indication of the peak charge, the output indicating when the first input is larger than the second input; and charge adding means responsive to the output of the comparator means for adding to the peak charge when the rectified low frequency content signal exceeds the present peak charge.

8. An automatic cable equalizer according to claim 6, wherein the scaling means comprises:

transconductance amplifying means having an input and an output, the input being coupled to receive the maximum low frequency content signal and the output being a current proportional to the magnitude of the maximum low frequency content signal; and signal producing means for receiving the output current from the transconductance amplifier and producing the clipping control signal proportionally to the received output current.

9. An automatic cable equalizer according to claim 8, wherein the transconductance amplifying means comprises:

a transconductance amplifier having an input and two outputs, the input being coupled to receive the maximum low frequency content signal and the outputs being two currents whose difference is proportional to the magnitude of the maximum low frequency content signal; and a plurality of current mirrors receiving the output currents from the transconductance amplifier operatively connected to establish the difference current.

10. An automatic cable equalizer according to claim 8, wherein the scaling means further comprises defeat comparator means having first and second inputs and an output, with the first input coupled to receive the maximum low frequency content signal and the second input coupled to receive a reference signal, and producing at the output a selection signal selecting the difference current or a fixed current as a basis for establishing the level of the clipping control signal.

* * * * *